United States Patent [19]

Hatakeyama

[11] Patent Number: 4,750,030
[45] Date of Patent: Jun. 7, 1988

[54] RESIN-MOLDED SEMICONDUCTOR DEVICE HAVING HEAT RADIATING PLATE EMBEDDED IN THE RESIN

[75] Inventor: Mikio Hatakeyama, Tokyo, Japan
[73] Assignee: NEC Corporation, Tokyo, Japan
[21] Appl. No.: 942,229
[22] Filed: Dec. 16, 1986

Related U.S. Application Data

[62] Division of Ser. No. 571,497, Jan. 17, 1984, Pat. No. 4,649,637.

[30] Foreign Application Priority Data

Jan. 17, 1983 [JP]  Japan .................................. 58-5680

[51] Int. Cl.⁴ .......................................... H01L 23/28
[52] U.S. Cl. .......................................... 357/72; 357/74;
357/81; 357/70
[58] Field of Search ..................... 357/72, 74, 81, 70

[56] References Cited

U.S. PATENT DOCUMENTS

| 3,423,516 | 1/1969 | Segerson | 357/71 |
| 3,629,672 | 12/1971 | Water | 357/72 |
| 4,503,452 | 3/1985 | Yokozawa et al. | 357/72 |
| 4,507,675 | 3/1985 | Fujii et al. | 357/72 |

FOREIGN PATENT DOCUMENTS

| 59-215751 | 12/1984 | Japan | 357/72 |
| 60-7750 | 1/1985 | Japan | 357/72 |
| 60-229352 | 11/1985 | Japan | 357/72 |

Primary Examiner—Martin H. Edlow
Assistant Examiner—Gregory A. Key
Attorney, Agent, or Firm—Burns, Doane, Swecker & Mathis

[57] ABSTRACT

A lead frame has a plurality of metallic heat radiating plates, leads connected to each metallic heat radiating plate, other leads separated from the metallic heat radiating plates and a common insulator web attached to the metallic heat radiating plates. When the lead frame is placed in the cavity of a mold, the metallic heat radiating plates are correctly positioned in the mold cavity by the insulating web and the connected leads. By effecting a resin molding under this condition, the metallic heat radiating plates are molded in resin such that a layer of resin with a uniform thickness cover the back surface of the respective metallic heat radiating plates.

5 Claims, 3 Drawing Sheets

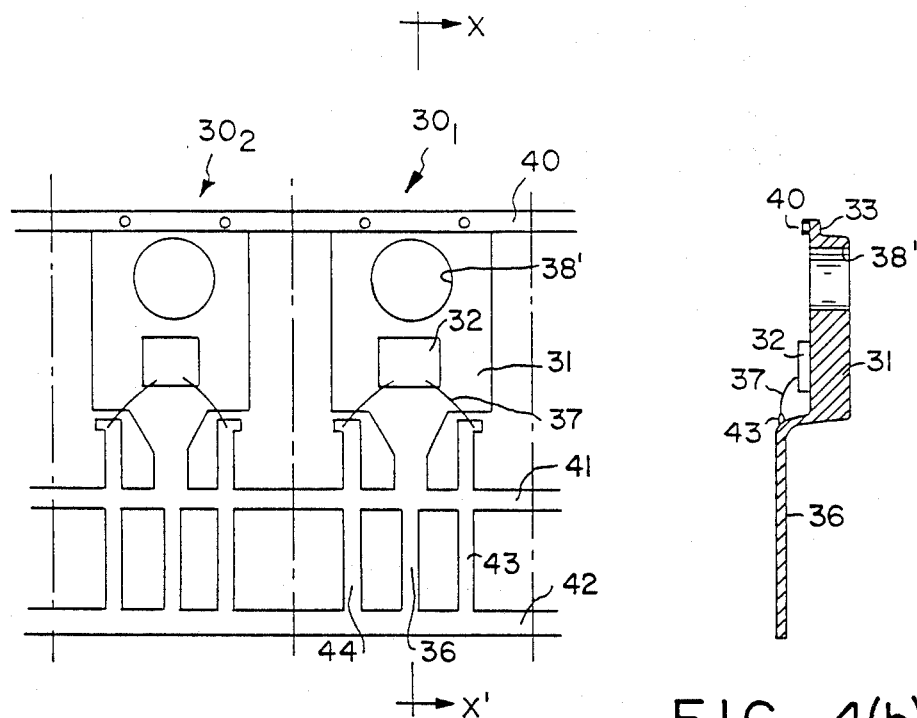
FIG. 4(a)
FIG. 4(b)
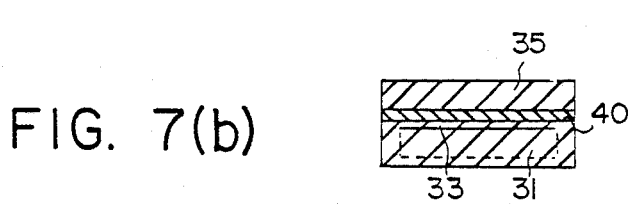
FIG. 7(b)
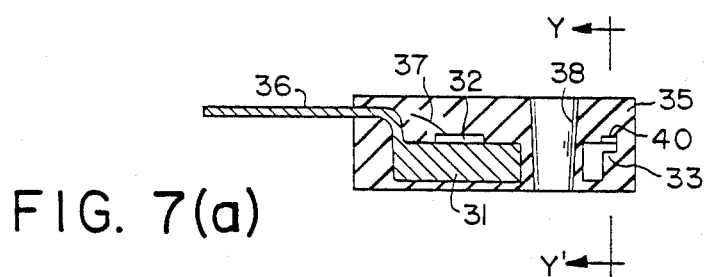
FIG. 7(a)

RESIN-MOLDED SEMICONDUCTOR DEVICE HAVING HEAT RADIATING PLATE EMBEDDED IN THE RESIN

This application is a division, of application Ser. No. 571,497, filed Jan. 17, 1984 now U.S. Pat. No. 4,649,637.

BACKGROUND OF THE INVENTION

1. Field of the Invention

The present invention relates to a resin-molded semiconductor device and, more particularly, to a construction of a resin-molded semiconductor device attachable directly to an external heat radiating fin.

2. Description of the Prior Art

In a typical semiconductor device in the prior art, a semiconductor pellet having a transistor formed thereon is attached to a predetermined portion of a metallic heat radiating plate. A collector lead is secured to the metallic heat radiating plate by, for example, welding, while the emitter and base leads are arranged such that they are positioned near the metallic heat radiating plate. The emitter and the base electrodes of the semiconductor pellet are connected to the emitter and base leads by bonding fine metallic wires. Then, the vicinity of the heat radiating plate including tips of the emitter and base leads are covered by a molded resin. In the production of this type of resin-molded semiconductor device, the back surface of the metallic heat radiating plate opposite to the surface on which the semiconductor pellet is attached is held in contact with the bottom of the mold during the resin molding process, so that the back surface of the metallic heat radiating plate is exposed through the molded resin in the final product.

Therefore, when this resin-molded semiconductor device is attached to an external heat radiating fin, it is necessary to interpose a thin insulating film between the exposed back surface of the metallic heat radiating plate and the external heat radiating fin. In the recent years, to obviate this trouble, a resin-molded semiconductor device has been devised such that the whole surface of the heat radiating plate is covered with the molded resin to permit a direct attaching of the semiconductor device to the external heat radiating fin.

The production of such a resin-molded semiconductor device, however, encounters a difficulty in keeping the heat radiating plate afloat in the mold cavity to cover the back surface of the heat radiating plate with the resin. To this end, the end of the heat radiating plate opposite to the end to which the collector lead is connected is thinned as much as possible and made to project over a small width, and the resin molding is conducted while cantilevering the heat radiating plate at the projected end by means of the mold. Thus, the heat radiating plate partially projects out of the molded resin in the final product. Therefore, when this resin-molded semiconductor device is mounted on the external heat radiating fin, an atmospheric discharge tends to take place between the heat radiating fin and the projected portion of the metallic heat radiating plate.

According to another known method of producing this type of resin-molded semiconductor device, the molding is conducted while supporting the metallic heat radiating plate afloat by means of pins which are projected into the mold cavity. In this case, holes are left in the molded resin after the withdrawal of the supporting pins, and the heat radiating plate is exposed through the holes. Consequently, atmospheric discharge tends to be caused between the exposed portions of the metallic heat radiating plate and the external heat radiating fin.

In order to prevent the atmospheric discharge, it has been proposed to apply an insulating paint to the projected or exposed portions of the heat radiating plate. The insulating paint, however, cannot provide sufficient dielectric strength and, hence, cannot prevent the atmospheric discharge perfectly.

SUMMARY OF THE INVENTION

Accordingly, a primary object of the present invention is to provide a resin-molded semiconductor device in which the metallic heat radiating plate supporting the semiconductor pellet is not exposed through the molded resin.

Another object of the present invention is to provide a method for producing a resin-molded semiconductor device in which the metallic heat radiating plate is not exposed through the molded resin, wherein the metallic heat radiating plate is correctly positioned and oriented in the resin during the molding process.

To these ends, according to an aspect of the invention, there is provided a resin-molded semiconductor device comprising: a semiconductor pellet; a heat radiating plate carrying the semiconductor pellet; an insulator web attached to the metallic heat radiating plate and extended over both sides of the metallic heat radiating plate; means for leading the electrodes of the semiconductor pellet to the outside; and a resin member which covers the semiconductor pellet, the metallic heat radiating plate, a part of the means for leading the electrodes to the outside and a portion of the insulator web except a part of the surface of the latter, the part of the surface of the insulator web being exposed in the surface of the resin member.

According to another aspect of the invention, there is provided a method for producing a semiconductor device comprising the steps of: attaching an insulator web to a metallic heat radiating plate such that the insulator web extends over both sides of the metallic heat radiating plate; attaching a semiconductor pellet to the metallic heat radiating plate; providing means for leading the electrodes of the semiconductor pellet to the outside; placing the metallic heat radiating plate, the semiconductor pellet, a part of the insulator web and a part of leading means in the cavity of a mold so as to clamp the other portion of the insulator web and the other portion of the means for leading the electrodes by means of the mold thereby to locate the metallic heat radiating plate in the mold; charging a resin into the cavity of the mold; solidifying the charged resin and taking out the solidified body from the mold; and removing by cutting the insulator web projecting from the surface of the solidified resin.

The semiconductor device of the invention exposes no conductive part except the means for leading the electrodes to the outside through the molded resin. Therefore, the undesirable atmospheric discharge is not generated between the metallic heat radiating plate and the external heat radiating fin to which the semiconductor device is attached. It is, therefore, possible to obtain a semiconductor device having a high dielectric strength and, hence, operable at a high voltage.

Furthermore, in the resin molding process, the metallic heat radiating plate is located correctly within the mold cavity by means of a web-like insulator so that the metallic heat radiating plate occupies the predetermined position in the resin. It is, therefore, possible to uniformalize the thickness of the molded resin under the metallic heat radiating plate and, accordingly, undesirable reduction of dielectric strength attributable to a lack of uniformity of resin thickness is avoided advantageously.

BRIEF DESCRIPTION OF THE DRAWINGS

The above and further objects, features and advantages of the present invention will become more apparent from the following detailed description taken in conjunction with the accompanying drawings, wherein:

FIG. 4a is a partial plan view of a lead frame used in a preferred embodiment of the present invention;

FIG. 4b is a sectional view taken along the line B—B' of FIG. 4a;

FIG. 7a is a sectional view of a preferred embodiment of the resin-molded semiconductor device in accordance with the present invention; and FIG. 7b is a sectional view taken along the line Y—Y' of FIG. 7a.

DETAILED DESCRIPTION

Figure 1:
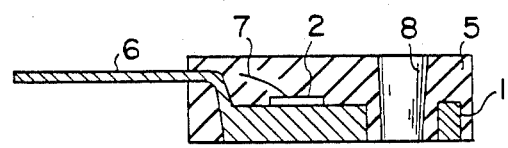
FIG. 1 is a sectional view of a resin-molded semiconductor device in the prior art.

FIG. 1 shows an example of a resin-molded semiconductor device in the prior art. This semiconductor device is provided by a process having the steps of preparing a metallic heat radiating plate having a lead 6 attached to one end thereof and base and emitter leads (not shown), securing a semiconductor pellet 2 to said metallic heat radiating plate 1, connecting the base and emitter leads to the electrodes of the semiconductor pellet 2 by means of fine metal wires, placing the metallic heat radiating plate 1 in the mold cavity, pouring a resin 5 into the mold cavity and solidifying the resin. The mold has a projection projecting into the cavity by means of which a threaded bore 8 is formed in the resion body 5.

In the resin molding process, the metallic heat radiating plate 1 is held in contact with the bottom of the mold cavity, so that the metallic heat radiating plate is exposed at the bottom of the product semiconductor device. Therefore, for securing the semiconductor device to the external heat radiating fin, it is necessary to interpose a thin insulating plate such as of mica between the bottom of the semiconductor device and the external heat radiating fin.

Figure 2:
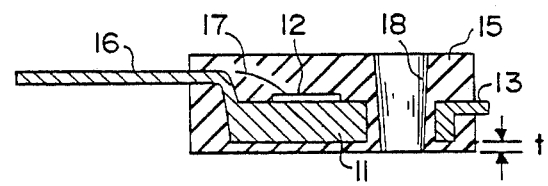
FIG. 2 is a sectional view of another resin-molded semiconductor device in the prior art.

In order to eliminate this thin insulating film, proposed is a resin-molded semiconductor device in which the bottom surface of the semiconductor device is entirely covered by the molded resin. However, since the metallic heat radiating plate has considerably large weight, the heat radiating plate is declined within the mold cavity if it is merely floated in the resin within the mold cavity. Due to the decline of the metallic heat radiating plate 1, the thickness of the resin layer under the metallic heat radiating plate 1 is made non-uniform as shown in FIG. 2. The dielectric strength between the metallic heat radiating plate 1 and the external heat radiating fin is determined by the smallest thickness of the resin under the metallic heat radiating plate 1. Consequently, the dielectric strength of the semiconductor device is decreased disadvantageously. This problem would be overcome by increasing the resin thickness under the metallic heat radiating plate. This, however, will be accompanied by an increase of the size of the semiconductor device as a whole.

Figure 3:
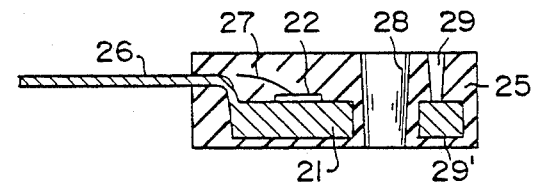
FIG. 3 is a sectional view of still another resin-molded semiconductor device in the prior art.

FIGS. 2 and 3 show other examples of conventional resin-molded semiconductor devices improved to realize a uniform thickness of the resin 15 and 25 under the metallic heat radiating plate 11 and 21. In the case of the semiconductor device shown in FIG. 2, a lead 16 is attached to one end of the metallic heat radiating plate 11 to which a semiconductor pellet 12 is secured, while the other end of the heat radiating plate 11 is provided with a thin metallic projection 13. During the molding process, the projection 13 is held together with the lead 16 in the mold to stably hold the metallic heat radiating plate 11 within the cavity, so that the molded resin 15 under the metallic heat radiating plate 11 in the final product can have a uniform thickness t. In this case, however, the metallic projection 13 is inevitably left to project from the resin 15 in the final product. A reference numeral 17 denotes fine metallic wires through which the electrodes on the semiconductor pellet 12 are connected to leads which are not shown, while a numeral 18 designates a threaded bore for receiving a mounting screw.

On the other hand, the conventional resin-molded semiconductor device shown in FIG. 3 has a metallic heat radiating plate 21 which has no projection. A lead 26 is attached to one end of the metallic heat radiating plate 21. In the production of this semiconductor device, the semiconductor pellet 22 is attached to the metallic heat radiating plate 21, and the electrodes on the semiconductor pellet 22 are connected by fine metallic wires to the base and emitter leads which are not shown. The assembly is then placed in the mold cavity. The mold is provided with small projections for supporting the metallic heat radiating plate 21, besides large projections for forming a threaded hole in the product. The heat radiating plate 21 is held by the small projections together with the leads, so that it can be correctly positioned within the mold cavity. Then, the resin is poured into the cavity and solidified to form a resin member 25. In this case, however, holes 29 and 29' are formed in the resin member 25 of the final product after the withdrawal of the small projections of the mold for supporting the heat radiating plate 21, so that the metallic heat radiating plate 21 is partly exposed through these holes 29 and 29'.

Thus, according to the semiconductor devices in the prior art, either the metallic projection 13 projecting from the metallic heat radiating plate 11 or the partial exposure of the metallic heat radiating plate 21 through the small holes is inevitable, in order to attain a uniform thickness of the resin member under the metallic heat radiating plates 11 and 21. When the conventional resin-molded semiconductor device shown in FIG. 2 or 3 is secured to the external heat radiating fin, an atmospheric discharge tends to occur between the projection 13 or the exposed portion of the metallic heat radiating plate 21 and the external heat radiating fin, resulting in a reduction or lack of stability of the dielectric strength of the final product. In order to avert from this problem, it has been proposed also to apply an insulating paint on the projection 13 or the exposed portions of the metallic heat radiating plate 21. The prevention of the atmospheric discharge by the insulating paint, however, is not so reliable and cannot be used practically.

These problems in the prior art, however, can be overcome by the present invention as will be understood from the following description of the preferred embodiments. FIGS. 4a and 4b show a lead frame used in a preferred embodiment of the present invention. The lead frame is formed by punching a metallic plate in the form of an integral member having a plurality of units $30_1, 30_2, \ldots$ connected in series. Each unit has a lead 36 for leading out the collector and leads 43 and 44 for leading out the emitter and the base. The leads 36, 43 and 44 are connected through transverse bars 41 and 42. The end of the lead 36 is secured by, for example, welding to a metallic heat radiating plate 31 having a threaded hole 38' formed therein. Each metallic heat radiating plate 31 is made of a metallic plate such as of copper having a thickness of, for example, 1.3 to 1.4 mm, and is provided at its end with a thin small projection 33 formed by press. The projection 33 projects from the metallic heat radiating plate 31 by a length of, for example, 1 mm. An insulator web 40 made from a glass epoxy resin and having a thickness of 0.5 mm and a width of 0.6 mm is attached to all the projections 33 in the units $30_1, 30_2, \ldots$ by bonding or caulking. A semiconductor pellet 32 of, for example, a transistor is attached to a predetermined portion of the heat radiating plate 31, and the electrodes on the semiconductor pellet 32 are connected to the leads 43 and 44 by bonding fine metallic wires 37.

Figure 5:
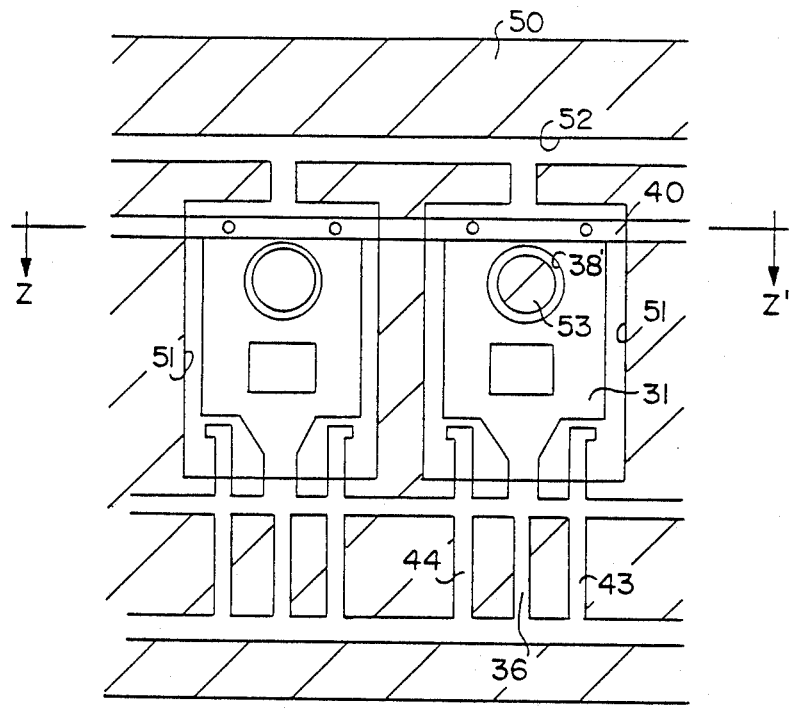
FIG. 5 is a plan view showing the relationship between the lead frame and a mold in the resin molding process in accordance with a preferred embodiment of the present invention.
Figure 6:
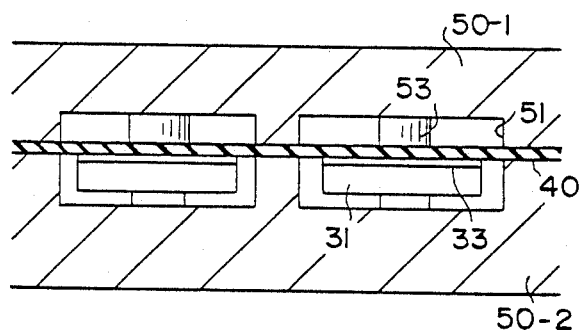
FIG. 6 is a sectional view taken along the line Z—Z' of FIG. 5.

The lead frame thus formed is placed in a mold 50, as shown in FIGS. 5 and 6. The mold 50 is composed of an upper mold half part 50-1 and a lower mold half part 50-2 which are adapted to form, when brought together, a resin runner 52 and cavities 51. The arrangement is such that the portion of the lead frame around the metallic heat radiating plate 31 is placed in the cavity 51. According to this arrangement, the leads 36, 43 and 44 and the insulator web 40 are clamped by the mold half parts, so that the metallic heat radiating plate 31 is stably held at a correct position in the cavity 51 by means of the lead 36 and the insulator web 40. A pin 53 is projected from the upper mold half part 50-1 downward into the cavity 51 to reach the lower mold half part 50-2 through the threaded hole 38' formed in the metallic heat radiating plate 36.

After placing this lead frame in the mold 50, epoxy resin is poured into the cavities 51 through the resin runner 52, and is solidified in due course. After the solidification of the resin, the molded bodies are taken out of the mold 50 and the transverse bars 41 and 42 are removed by cutting. Then, the insulator web 40 is cut at the side surface of the resin 35.

FIGS. 7a and 7b show sections of the thus severed semiconductor device. The resin member 35 is sized to be, for example, 10 mm in width, 17 mm in length and 4.5 mm in thickness, while the length of the leads 36, 43 and 44 projecting from the resin 35 is 14 mm. The threaded hole 38 has a diameter of 3.2 mm at its upper end opening but the lower end opening of the same has a diameter smaller than the upper end opening.

In the thus produced semiconductor device, the resin member 35 under the metallic heat radiating plate 31 can have a uniform thickness of 0.35 to 0.65 mm, preferably 0.4 mm to 0.5 mm, because the resin molding is conducted while correctly positioning the metallic heat radiating plate 31 in the mold cavity 51. In the final product, only the cut surface of the insulator web 40 besides the leads 36, 43 and 44 is exposed on the surface of the resin member 35, so that the undesirable atmospheric discharge can be avoided when the semiconductor device is attached to the external heat radiating fin. The maximum voltage applicable to the metallic heat radiating plate 31 is determined by the dielectric strength of the resin member 35 under the metallic heat radiating plate 31. In addition, the resin-molded semiconductor device of the present invention can be produced merely by adding a simple step to the conventional process for producing the resin-mold semiconductor device shown in FIG. 1. This additional step can be made without requiring any strict control.

Although the present invention has been described through a preferred embodiment applied to a semiconductor pellet having a transistor, this is not exclusive and the invention can equaly be applied to other devices such as a power integrated circuit incorporating a metallic heat radiating plate. The use of the glass epoxy resin as the material of the insulator web 40 is not exclusive. Namely, the insulator web may be formed from other insulator material than the described glass epoxy resin, provided that the material has a softening point higher than the temperature at which the resin member 35 is molded. The insulator web 40 may be directly attached to other portions of the metallic heat radiating plate than the projection 33. Silicone resins and other insulative resins can be used in place of the epoxy resin used as the material of the resin member 35.

What is claimed is:

1. A resin-molded semiconductor device comprising:
   a metallic heat radiating plate;
   a semiconductor pellet attached to said heat radiating plate;
   a first lead for external connection connected at its one end to said heat radiating plate;
   at least one second lead for external connection having an end disposed in the vicinity of said metallic heat radiating plate;
   means for electrically connecting an electrode of said semiconductor pellet to said second lead;
   an insulator web attached to one end of said metallic heat radiating plate and extending therefrom to the outside of said metallic heat radiating plate; and
   a resin member covering said metallic heat radiating plate, said semiconductor pellet, said connecting means and a part of said insulator web, said insulator web having a portion exposed from said resin member and said metallic heat radiating plate being completely covered by said resin member.

2. The resin-molded semiconductor device as claimed in claim 1, wherein said metallic heat radiating plate and said resin member are provided with threaded holes to form a hole in said semiconductor device, the inner wall of the threaded hole of said metallic heat radiating plate being covered by said resin member.

3. The resin-molded semiconductor device as claimed in claim 1, wherein said heat radiating plate is provided at said one end with a metallic projection, said insulator web being secured to said metallic projection.

4. The resin-molded semiconductor device as claimed in claim 1, wherein a portion of said resin member covering the opposite surface of said metallic heat radiating plate to the surface where said semiconductor pellet is attached has a substantially uniform thickness of 0.35 to 0.65 mm.

5. The resin-molded semiconductor device as claimed in claim 1, wherein the surface of said insulator web exposed from said resin member is flush with the surface of said resin member.

* * * * *